United States Patent
Bedell et al.

(10) Patent No.: US 7,067,400 B2
(45) Date of Patent: Jun. 27, 2006

(54) METHOD FOR PREVENTING SIDEWALL CONSUMPTION DURING OXIDATION OF SGOI ISLANDS

(75) Inventors: Stephen W. Bedell, Wappingers Falls, NY (US); Anda C. Mocuta, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/943,354

(22) Filed: Sep. 17, 2004

(65) Prior Publication Data
US 2006/0063358 A1   Mar. 23, 2006

(51) Int. Cl.
*H01L 21/20* (2006.01)
*H01L 21/36* (2006.01)

(52) U.S. Cl. .................. 438/479; 438/483; 438/967
(58) Field of Classification Search ............... 438/483, 438/479, 967, FOR. 291
See application file for complete search history.

(56) References Cited

U.S. PATENT DOCUMENTS

| 6,727,550 B1 * | 4/2004 | Tezuka et al. ............. 257/347 |
| 2004/0195624 A1 * | 10/2004 | Liu et al. ..................... 257/347 |
| 2004/0235264 A1 * | 11/2004 | Forbes ........................ 438/429 |
| 2004/0235274 A1 * | 11/2004 | Kurita et al. ............... 438/483 |
| 2004/0248354 A1 * | 12/2004 | Chidambaram et al. .... 438/201 |
| 2005/0054175 A1 * | 3/2005 | Bauer ......................... 438/404 |
| 2005/0093021 A1 * | 5/2005 | Ouyang et al. ............. 257/194 |

* cited by examiner

*Primary Examiner*—Michelle Estrada
(74) *Attorney, Agent, or Firm*—Scully, Scott, Murphy & Presser, P.C.; Robert M. Trepp (57) ABSTRACT

A method of forming a substantially relaxed SiGe-on-insulator substrate in which the consumption of the sidewalls of SiGe-containing island structures during a high temperature relaxation annealing is substantially prevented or eliminated is provided. The method serves to maintain the original lateral dimensions of the patterned SiGe-containing islands, while providing a uniform and homogeneous Ge fraction of the islands that is independent of each island size. The method includes forming an oxidation mask on at least sidewalls of a SiGe-containing island structure that is located on a barrier layer that is resistant to Ge diffusion. A heating step is then employed to cause at least relaxation within the SiGe-containing island structure. The presence of the oxidation mask substantially prevents consumption of at least the sidewalls of the SiGe-containing island structure during the heating step.

24 Claims, 4 Drawing Sheets

METHOD FOR PREVENTING SIDEWALL CONSUMPTION DURING OXIDATION OF SGOI ISLANDS

RELATED APPLICATIONS

This application is related to co-assigned and co-pending U.S. Ser. No. 10/300,189, filed Nov. 20, 2002, entitled "RELAXED, LOW-DEFECT SGOI FOR STRAINED Si CMOS APPLICATIONS". The entire content of this related application is incorporated herein by reference.

FIELD OF THE INVENTION

The present invention is related to a method of fabricating a semiconductor substrate material, and more particularly to a method of fabricating a substantially relaxed, low-defect SiGe-on-insulator (SGOI) substrate material. Specifically, the present invention provides a method of fabricating a SGOI substrate material in which an oxidation mask is used to protect at least the sidewalls of SiGe-containing islands during a heating step that causes relaxation and optionally interdiffusion within the SiGe-containing islands. The oxidation mask substantially eliminates or inhibits at least sidewall consumption of the SiGe-containing islands.

BACKGROUND OF THE INVENTION

Compressively strained SiGe-on-insulator (SGOIs) or SiGe/Si-on-insulator materials which have been patterned into islands over the oxide have shown to relax by expansion of the SiGe layer on the viscous oxide during a high-temperature annealing step (T>1150° C.). This method of forming highly relaxed, high quality SGOI in conjunction with thermal mixing is described, for example, in U.S. Ser. No. 10/300,189, filed Nov. 20, 2002, which application was previously incorporated herein by reference.

The extent of relaxation is, in general, greater than would occur if the SiGe film was not patterned. Furthermore, the patterned and annealed SGOI islands have a significantly lower crystal defect density than continuous SiGe layers which have been relaxed.

Because patterning of initially continuous semiconductor films into islands is one of the first steps in modern silicon-on-insulator (SOI) complementary metal oxide semiconductor (CMOS) processing, it is natural to merge the relaxation step of the SGOI material with the patterning step (i.e., shallow trench isolation). This way, the material advantage of enhanced relaxation and defect reduction obtained by relaxing the patterned SiGe layers is streamlined by integrating the SGOI formation with an existing SOI CMOS processing step.

One of the challenges facing this approach is that the island features are well-defined by the CMOS technology and should not be altered or distorted by the high-temperature SiGe relaxation annealing step. If the sidewalls of the SiGe or SiGe/Si islands are oxidized during the relaxation anneal, then the consumption of the sidewall during this process will change the dimensions of the island.

Another related concern is that oxidation of a SiGe material tends to reject the Ge from the growing oxide layer. Therefore, the Ge fraction in smaller island sizes (where the surface/volume ratio is high) will increase more rapidly than the Ge content in larger islands (where sidewall oxidation effects are negligible with respect to the Ge content). Furthermore, annealing performed in an inert ambient grows some amount of oxide at these high temperatures due to the presence of trace amounts of moisture in the annealing gases.

In view of the above, there is a need for providing a way to limit and/or eliminate the oxidation of the sidewalls of the SiGe-containing islands in order to maintain (1) the original lateral dimensions of the patterned islands and (2) a uniform and homogeneous Ge fraction which is independent of island size while still permitting island relaxation to occur.

SUMMARY OF THE INVENTION

A main object of the present invention is thus to provide a method that is capable of substantially limiting and even eliminating the oxidation of the sidewalls of SiGe-containing islands during a high temperature relaxation annealing. Such a method would serve to maintain the original lateral dimensions of the patterned SiGe-containing islands, while providing a uniform and homogeneous Ge fraction of the islands that is independent of each island size.

The inventive method disclosed herein achieves the above objectives by utilizing an oxidation masking layer, such as silicon dioxide, silicon nitride or a combination thereof, on at least the sidewalls of each SiGe-containing island thus substantially eliminating or inhibiting the amount of oxidation that takes places in those regions during a subsequent high temperature relaxation anneal.

Specifically, and in broad terms, the method of the present invention comprises the steps of:

forming an oxidation mask on at least sidewalls of a SiGe-containing island structure, said Si-containing island structure is located on a barrier layer that is resistant to Ge diffusion; and heating to cause at least relaxation within said SiGe-containing island structure whereby said oxidation mask substantially prevents consumption of at least the sidewalls of said SiGe-containing island structure during said heating step.

The SiGe-containing island structure may comprise a bilayer stack of a strained or partially relaxed SiGe layer located atop a single crystal Si layer. Alternatively, the SiGe-containing island structure comprises a strained or partially relaxed SiGe layer.

In embodiments in which the SiGe-containing stack is a bilayer comprising SiGe and Si, the heating step also causes interdiffusion of Ge within the SiGe and Si layers.

In yet other embodiments of the present invention, the oxidation mask is located only on the sidewalls of the SiGe-containing island structure, while in yet another embodiment, the oxidation mask is located on the sidewalls and an exposed horizontal surface of the SiGe-containing island structure.

DETAILED DESCRIPTION OF THE INVENTION

The present invention, which provides a method for substantially preventing or eliminating sidewalls consumption during oxidation of SGOI islands, is now described in more detail by referring to the drawings that accompany the present application. It is noted that the drawings of the present invention are provided for illustrative purpose and thus they are not drawn to scale.

Figure 1:
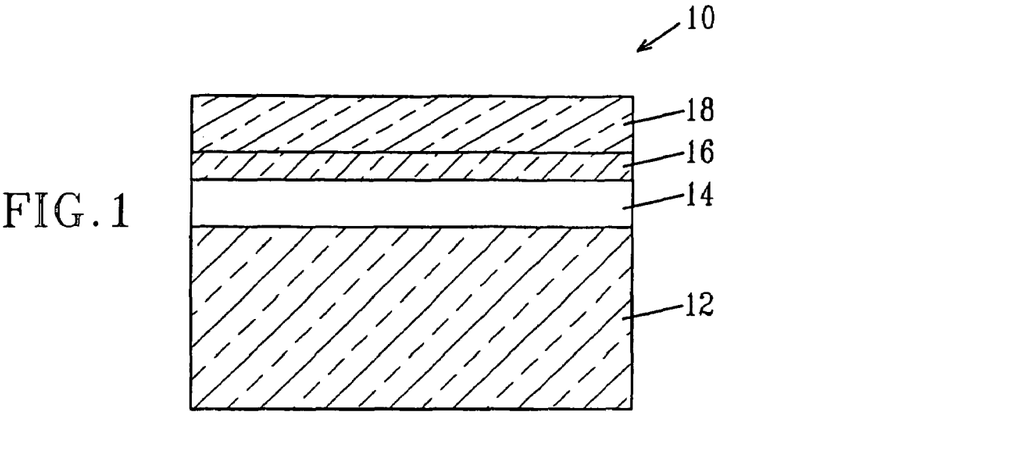
FIG. 1 is a pictorial representation (through a cross sectional view) illustrating an initial structure that can be utilized in the method of the present invention which includes a strained SiGe layer and an optional Si layer atop a barrier layer that is resistant to Ge diffusion.

Reference is first made to FIG. 1 which shows an initial structure 10 that can be employed in the present invention. The initial structure 10 includes a semiconductor substrate layer 12, a barrier layer 14 that is resistant to Ge diffusion (hereinafter "barrier layer") present atop a surface of the Si-containing substrate layer 12, an optional first single crystal Si layer 16 having misfit and TD densities of less than about $1 \times 10^5$ defects/cm$^2$ present atop the barrier layer 14 and a SiGe layer 18 located atop the single crystal Si layer 16, if present, or atop the barrier layer 14, if layer 16 is not present. The SiGe layer 18 can be fully strained or partially relaxed. The term "partially relaxed" denotes a SiGe layer having a measured relaxation value of about 60% or less.

The barrier layer 14 of the present invention can be a continuous barrier layer as is shown in FIG. 1, or it may comprise discrete and isolated regions or islands that are surrounded by semiconductor material, i.e., layers 12 and 16, if present, or 18, if layer 16 is not present. The later is not shown in the drawings of the present invention, but is contemplated herein.

Notwithstanding whether the barrier layer 14 is patterned or unpatterned, the initial structure 10 comprises a conventional silicon-on-insulator (SOI) substrate material which includes layers 12, 14 and 16 having a strained SiGe layer 18 formed thereon or a silicon germanium-on-insulator (SGOI) substrate which includes layers 12, 14 and 18. The top SiGe layer 18 of the SGOI substrates can be strained or partially relaxed. In both substrates, region 14 is a buried insulating region which electrically isolates the first single crystal Si layer 16 or SiGe layer 18 from Si-containing semiconductor substrate 12. The term "Si-containing" as used herein denotes a semiconductor substrate that includes at least silicon. Illustrative examples include, but are not limited to: Si, SiGe, SiC, SiGeC, Si/Si, Si/SiC, Si/SiGeC, and preformed silicon-on-insulators which may include any number of buried oxide (continuous, non-continuous or mixtures of continuous and non-continuous) regions present therein.

The SOI substrate which includes layers 12, 14 and 16 may be formed utilizing conventional SIMOX (separation by ion implantation of oxygen) processes well-known to those skilled in the art, as well as the various SIMOX processes mentioned in co-assigned U.S. patent application Ser. No. 09/861,593, filed May 21, 2001; Ser. No. 09/861,594, filed May 21, 2001; Ser. No. 09/861,590, filed May 21, 2001; Ser. No. 09/861,596, filed May 21, 2001; and Ser. No. 09/884,670, filed Jun. 19, 2001 as well as U.S. Pat. No. 5,930,634 to Sadana, et al., the entire contents of each are incorporated herein by reference. Note that the process disclosed in the '590 application can be employed herein to fabricate a patterned SOI substrate Alternatively, the SOI substrate material may be made using other conventional processes including, for example, a layer transfer process in which thermal bonding and cutting are employed.

The SGOI substrate, which includes layers 12, 14 and 18, is formed by conventional techniques well known in the art including, for example, ion implantation or a layer transfer process. A thermal mixing process can also be used in forming the SGOI substrate.

Barrier layer 14 of the structure 10 shown in FIG. 1 comprises any insulating material that is highly resistant to Ge diffusion. Examples of such insulating and Ge diffusion resistant materials include, but are not limited to: crystalline or non-crystalline oxides or nitrides.

The thickness of the various layers of the structure 10 may vary depending on the process used in making the same. Typically, however, the optional single crystal Si layer 16 has a thickness from about 1 to about 2000 nm, with a thickness from about 10 to about 200 nm being more highly preferred. In the case of the barrier layer 14 (i.e., Ge diffusion resistant layer), that layer may have a thickness from about 1 to about 1000 nm, with a thickness from about 20 to about 200 nm being more highly preferred. The thickness of the Si-containing substrate layer, i.e., layer 12, is inconsequential to the present invention. It is noted that the thicknesses provided above are exemplary and by no ways limit the scope of the present invention.

The SiGe layer 18 which can be formed atop an SOI substrate or be the top layer of a SGOI substrate is an alloy layer that has the formula $Si_xGe_{1-x}$ wherein x is 0 or a number less than 1. The SiGe layer 18 of the present invention may comprise SiGe alloys having up to 99.99 atomic percent Ge (when x is less than 1), as well as pure Ge (when x=0) that comprise 100 atomic percent Ge. In one embodiment of the present invention, it is preferred that the Ge content in the SiGe layer 18 be from about 0.1 to about 99.9 atomic percent, with a Ge atomic percent of from about 10 to about 35 being even more highly preferred.

In accordance with some embodiments of the present invention, the SiGe layer 18 is formed atop the first single crystal Si layer 16 using a conventional epitaxial growth method that is well-known to those skilled in the art which is capable of (i) growing a thermodynamically stable (below a critical thickness) SiGe alloy, or (ii) growing a SiGe alloy layer that is metastable and free from defects, i.e., misfit and TD dislocations. Illustrative examples of such epitaxial growing processes that are capable of satisfy conditions (i) or (ii) include, but are not limited to: low-pressure chemical vapor deposition (LPCVD), ultra-high vacuum chemical vapor deposition (UHVCVD), atmospheric pressure chemical vapor deposition (APCVD), molecular beam epitaxy (MBE) and plasma-enhanced chemical vapor deposition (PECVD).

In some embodiments of the present invention, the SiGe layer 18 is formed using isotopically enriched Si and Ge gas sources.

As stated above, the SiGe layer 18 can be strained or partially relaxed. The strain layer is formed as described above. If a partially relaxed SiGe layer is employed, a strained SiGe layer is formed as described above and then it is subjected to a heating step which is performed at a temperature to form a partially relaxed layer. This heating step that causes partial relaxation is carried out at a temperature from about 900° to about 1335° C., with a temperature from about 1150° to about 1320° C. being more highly preferred.

Moreover, the heating step that causes partial relaxation of the SiGe layer 18 is carried out in an oxidizing ambient which includes at least one oxygen-containing gas such as $O_2$, NO, $N_2O$, $H_2O$ (steam), ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. The heating step causing partial relaxation may be carried out for a variable period of time which typically ranges from about 10 to about 1800 minutes, with a time period from about 60 to about 600 minutes being more highly preferred. The heating step causing partial relaxation may be carried out at a single targeted temperature, or various ramp and soak cycles using various ramp rates and soak times can be employed.

Note that the heat step that forms the partially relaxed SiGe layer 18 atop the surface of barrier layer 14 may cause some interdiffusion within Si layer 16, if such a layer is present. It is also noted that a thin oxide layer typically begins to form atop the partially relaxed SiGe layer at this point of the present invention.

In other embodiments, the SiGe layer 18 is formed directly on the barrier layer 14 utilizing one of the processes mentioned above.

The thickness of the SiGe layer 18 may vary, but typically the SiGe layer 18 has a thickness from about 10 to about 500 nm, with a thickness from about 20 to about 200 nm being more highly preferred.

In one alternative embodiment of the present invention, an optional cap layer can be formed atop the SiGe alloy layer 18 prior to performing the next steps of the present invention. This alternative embodiment of the present invention is not illustrated in the drawings of the present application. The optional cap layer employed in the present invention comprises any Si material including, but not limited to: epitaxial silicon (epi-Si), amorphous silicon (a:Si), single or polycrystalline Si or any combination thereof including multilayers. In a preferred embodiment, the cap layer is comprised of epi Si.

When present, optional cap layer has a thickness from about 1 to about 100 nm, with a thickness from about 1 to about 30 nm being more highly preferred. The optional cap layer is formed utilizing any well-known deposition process including the epitaxial growth processes mentioned above.

Figure 2:
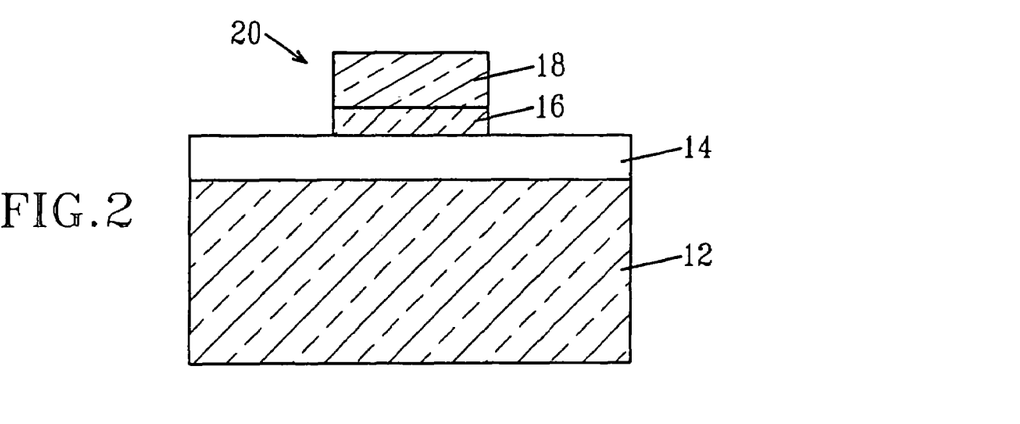
FIG. 2 is a pictorial representation (through a cross sectional view) illustrating the structure of FIG. 1 after patterning the strained SiGe and the optional Si layer into an individual island structure.

Next, the structure, with or without the optional Si cap layer, is patterned so as to provide the structure illustrated in FIG. 2; the drawing illustrates the case when no Si cap layer is present. Specifically, the structure, with or without the optional Si cap layer, is patterned by using conventional lithography and etching to provide an array of islands 20 on the surface of barrier layer 14. Since each island 20 includes at least SiGe layer 18, the islands 20 can be referred to herein as a SiGe-containing island structure. In one embodiment, the SiGe-containing island structure 20 includes the SiGe layer 18. In another embodiment, the SiGe-containing island structure 20 includes the single crystal Si layer 16 and the SiGe layer 18. In both these embodiments, optional Si cap can be formed atop the SiGe layer 18.

The lithography step includes applying a photoresist (not shown) to the surface of the structure, either atop the SiGe layer 18 or the optional Si cap layer, exposing the photoresist to a pattern of radiation, and developing the pattern into the photoresist by utilizing a conventional resist developer. Note that the patterned photoresist protects portions of the structure, while leaving other portions of the structure exposed. With the patterned photoresist in place, the exposed portions of the structure are then etched stopping atop the barrier layer 14. In some embodiments, the etching step thus removes exposed portions of the SiGe layer 18 as well as the optional single crystal Si layer 16 underlying the exposed portions of the SiGe layer 18, while in other embodiments, the optional Si cap is first etched and thereafter the underlying SiGe layer 18 and the optional single crystal Si layer 16 may be removed.

The etching step may be carried out using a single etching step, or multiple etching steps may be employed in forming the structure shown, for example, in FIG. 2. Notwithstanding whether a single- or multiple-etching process is performed, etching may be performed using a conventional dry etching process such as, reactive-ion etching, plasma etching, ion beam etching, laser ablation or any combination thereof. In addition to dry etching, the present invention also contemplates that this etching step may include the use of a wet chemical etching process or a combination of wet etching and dry etching may be performed. When wet chemical etching is utilized, a chemical etching that is highly selective in removing Si as compared to oxide or nitride is employed. Following etching the patterned photoresist is removed at this point of the inventive process utilizing a conventional resist stripping process.

The patterned layers of the SiGe layer 18, and, if present the optional Si layer 16 and, if present, the optional Si cap layer 18 are referred to herein as an island 20. It is noted that although the drawings depict the formation of a single island 20, the present invention also contemplates the formation of a multitude, i.e., an array, of such islands 20 on the surface of barrier layer 14. Each island 20 is generally small in size, having a lateral width of about 500 µm or less. More preferably, each of the islands 20 has a lateral width of from about 0.01 to about 100 µm.

It should be noted that the width of the island 20 formed by the present invention must be sufficient to permit relaxation of the SiGe film 18 by ensuring that the forces of relaxation in the island 20 outweigh the forces that oppose relaxation.

In some embodiments, the optional Si cap layer may be formed atop the patterned surface of SiGe alloy layer 18 at this point of the present invention. This embodiment of the present invention is not specifically illustrated in the present invention.

Figure 3:
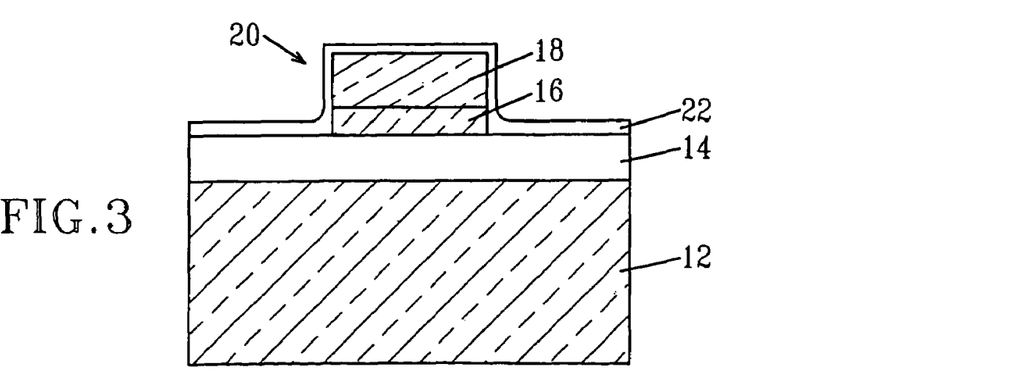
FIG. 3 is a pictorial representation (through a cross sectional view) illustrating the structure of FIG. 2 after forming an oxidation mask thereon.

At this point of the present invention, an oxidation mask 22 such as is illustrated in FIG. 3 is formed on the surface of the structure including the island 20. Specifically, the oxidation mask 22 is formed such that is surrounds at least the exposed surfaces, e.g., the horizontal and vertical surfaces, of the island 20 as well as the exposed surface of barrier layer 14. The oxidation mask 22 can be formed by a deposition process including, for example, chemical vapor deposition (CVD), plasma enhanced chemical vapor deposition (PECVD), chemical solution deposition, atomic layer deposition, physical vapor deposition and other like deposition processes. Alternatively, the oxidation mask 22 can be formed by a thermal process. The formation of the oxidation mask 22 can exist as a product of forming a neighboring trench isolation region in which a thin oxide layer is formed first followed by the formation of oxidation mask 22.

The oxidation mask 22 comprises any insulating material that is capable of preventing consumption of at least the sidewalls of the island 20. Illustrative examples of materials that can be used in forming the oxidation mask 22 include oxides, nitrides and combinations, including multilayers thereof. An example of an oxide-nitride combination is Si oxynitride. Preferred oxidation masks are those that comprise $SiO_2$, SiN or a combination thereof. In some embodiments, the oxidation mask 22 is a nitride that has a positive or negative stress.

The thickness of the oxidation mask 22 can vary so long as it is thick enough to prevent unwanted consumption of the sidewalls of the island 20. Typically, the oxidation mask 22 has a thickness from about 5 to about 200 nm, with a thickness from about 10 to about 100 nm being more typical.

Figure 4:
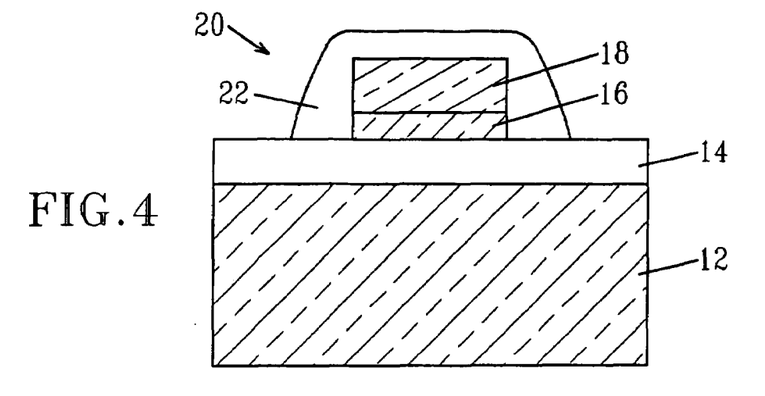
FIG. 4 is a pictorial representation (through a cross sectional view) illustrating one possible patterned configuration for the oxidation mask.
Figure 5:
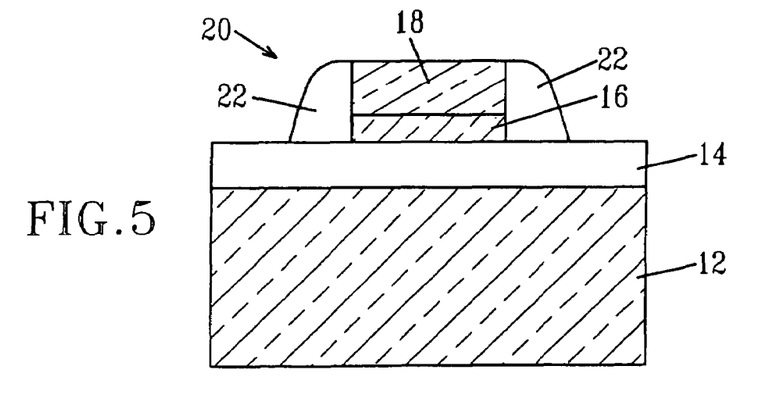
FIG. 5 is a pictorial representation (though a cross sectional view) illustrating another possible patterned configuration for the oxidation mask, particularly a spacer-like oxidation mask is shown.

Different etching schemes can now be optionally employed to maintain the oxidation mask 22 on surfaces only where oxidation is to be inhibited. FIGS. 4 and 5 shows the structure that is formed after performing various types of etching schemes. It is noted that in FIG. 3 and FIG. 4 only diffusion and/or oxidation will occur within the original layered structure as the island 20 is protected on all sides, including the top surface of the island 20, by the oxidation mask 22. FIG. 5 shows a spacer-like oxidation mask 22 that is useful if oxidation thinning of the island 20 is desired, without distorting the lateral geometry of the structure.

Figure 6:
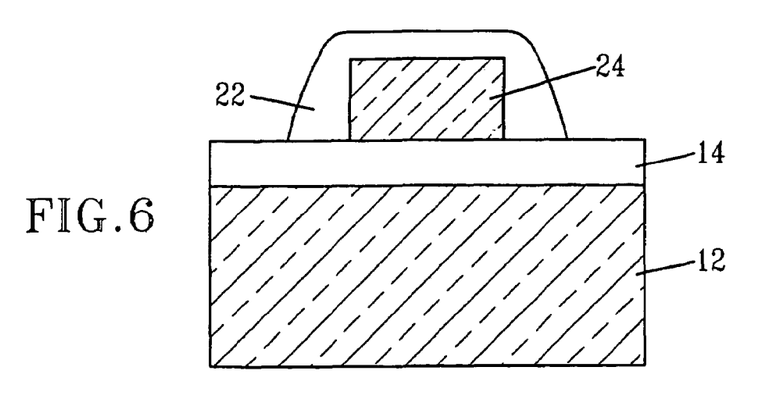
FIG. 6 is a pictorial representation (through a cross sectional view) illustrating the structure after the high temperature heating step is performed.
Figure 7:
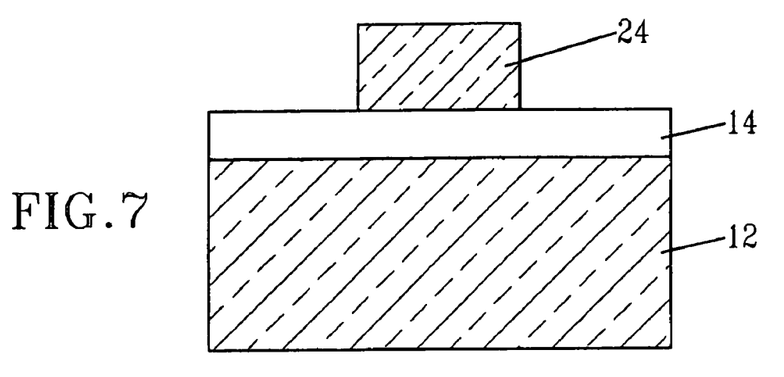
FIG. 7 is a pictorial representation (through a cross sectional view) illustrating a final SGOI substrate that is prepared in the present invention after the high temperature relaxation anneal and after removing the oxidation mask.

The structure containing the island 20 that is protected with the oxidation mask 22 is then heated, i.e., annealed, at a temperature which permits relaxation of the SiGe layer 18 and, if the Si layer 16 is present, subsequent interdiffusion of Ge throughout the first single crystal Si layer 16, the SiGe alloy layer 18 and, optionally the Si cap thereby forming substantially relaxed, single crystal SiGe layer 24 atop the barrier layer 14 (See, for example, FIG. 6). The relaxation anneal may be performed separately from the interdiffusion anneal or combined in one annealing process. The heating can be performed in a tube furnace or using rapid-thermal annealing (RTA) tools. Note that a surface oxide layer (not specifically shown) is formed atop the structure during the heating step. This oxide layer is typically, but not always, removed from the structure after the heating step using a conventional wet etch process wherein a chemical etchant such as HF that has a high selectivity for removing oxide as compared to SiGe is employed, See FIG. 6. Alternatively, this oxide layer may be removed using a conventional dry etching process such as reactive-ion etching. Note that this etching also may remove the oxidation mask 22 or a separate etch may be performed to remove mask 22. The structure after the oxidation mask 22 has been removed is shown in FIG. 7.

Note that when the surface oxide layer and masking layer 22 is removed, a second single crystal Si layer 26 can be formed atop relaxed SiGe layer 24 and the above processing steps of the present invention may be repeated any number of times to produce a multilayered relaxed SiGe substrate material.

The surface oxide layer formed after the heating step of the present invention has a variable thickness which may range from about 2 to about 2000 nm, with a thickness of from about 2 to about 500 nm being more highly preferred.

Specifically, the heating step of the present invention is an annealing step which is performed at a temperature of from about 900° to about 1350° C., with a temperature of from about 1200° to about 1335° C. being more highly preferred. Moreover, the heating step of the present invention can be carried out in an oxidizing ambient which may include at least one oxygen-containing gas such as $O_2$, NO, $N_2O$, $H_2O$ (steam), ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The heating step may be carried out for a variable period of time which typically ranges from about 10 to about 1800 minutes, with a time period from about 60 to about 600 minutes being more highly preferred. The heating step may be carried out at a single targeted temperature, or various ramp and soak cycles using various ramp rates and soak times can be employed.

The heating step can be performed under an oxidizing ambient to achieve the presence of a surface oxide layer that acts as a diffusion barrier to Ge atoms. Therefore, once the oxide layer is formed on the surface of the structure, Ge becomes trapped between barrier layer 14 and the in-situ formed oxide layer. As the surface oxide increases in thickness, the Ge can become more uniformly distributed throughout layer 18 and optionally layer 16 and if present, the Si cap, but it is continually and efficiently rejected from the encroaching oxide layer. So as the (now homogenized) layers can be thinned during this heating step, the relative Ge fraction increases. Efficient thermal mixing is achieved in the present invention when the heating step is carried out at a temperature of from about 1200° to about 1320° C. in a diluted oxygen-containing gas.

It is also contemplated herein to use a tailored heat cycle which is based upon the melting point of the SiGe alloy layer. In such an instance, the temperature is adjusted to tract below the melting point of the SiGe alloy layer.

Note that if the oxidation occurs too rapidly, Ge cannot diffuse away from the surface oxide/SiGe interface fast enough and is either transported through the oxide (and lost) or the interfacial concentration of Ge becomes so high that the alloy melting temperature will be reached.

The role of the heating step of the present invention is in some embodiments (1) to allow Ge atoms to diffuse more quickly thereby maintaining a homogeneous distribution during annealing; and (2) to subject the ('initially') strained layer structure to a thermal budget which will facilitate an equilibrium configuration. After this heating step has been performed, the structure includes a uniform and substantially relaxed SiGe alloy layer, i.e., layer 24, sandwiched between barrier layer 14 and surface oxide layer.

In accordance with the present invention, substantially relaxed SiGe layer 24 has a thickness of about 2000 nm or less, with a thickness from about 10 to about 200 nm being more highly preferred. Note that the substantially relaxed SiGe layer 24 formed in the present invention is thinner than prior art SiGe buffer layers and has a defect density including misfits and TDs, of about $5 \times 10^6$ defects/cm$^2$ or less.

The substantially relaxed SiGe layer 24 formed in the present invention has a final Ge content of from about 0.1 to about 99.9 atomic percent, with an atomic percent of Ge of from about 10 to about 35 being more highly preferred. Another characteristic feature of substantially relaxed SiGe layer 24 is that it has a measured lattice relaxation of from about 50% or greater, with a measured lattice relaxation from about 75 to about 100% being more typically preferred. It is noted that 100% relaxation is most preferred in the present invention.

As stated above, the surface oxide layer and the masking layer 22 may be stripped at this point of the present invention so as to provide the SiGe-on-insulator substrate material shown, for example, in FIG. 7.

Figure 8:
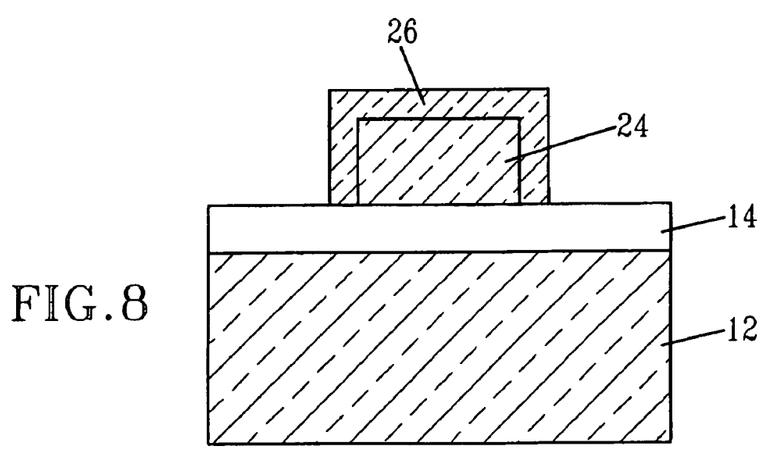
FIG. 8 is a pictorial representation (through a cross sectional view) illustrating the SGOI substrate shown in FIG. 7 after a strained semiconductor layer is formed surrounding the now relaxed SGOI island structure.

FIG. 8 shows the structure after second single crystal Si layer 26 is formed on the structure shown in FIG. 7. The second single crystal Si layer 26 is formed by a selective epitaxial growth process and layer 26 typically has a thickness from about 5 to about 50 nm. Note that the second single crystal Si layer 26 does not form on oxide or nitride regions. In some embodiments, the single crystal Si layer 26 is formed using an isotopically enriched Si gas source. Layer 26 can be replaced by another semiconductor material such as SiGe, SiGeC, SiC, GaAs, InAs or InP, as desired.

In the embodiment described above, hydrogen ions can be implanted in such a way as to place the peak of the implanted ion distribution at or near the barrier layer/top Si or SiGe interface. This can enhance the relaxation of the SiGe layer and can be used in conjunction with the patterning methods described here. The hydrogen ion implantation can be performed using the techniques and conditions disclosed in co-assigned U.S. application Ser. No. 10/196,611, filed Jul. 16, 2002, the entire content of which is incorporated herein by reference. In place of hydrogen, deuterium, helium, oxygen, neon and other like ions that are capable of forming defects that allow enhanced relaxation at or near the first single crystal Si/barrier layer interface can be employed. Mixtures of the above-mentioned ions are also contemplated herein. Preferred ions include hydrogen ions, and preferred conditions include: an ion concentration of below 3E16 atoms/cm$^2$ and an implant energy of from about 1 to about 100 keV. The ions can be implanted before or after patterning on any of the three embodiments mentioned above.

The present invention also contemplates superlattice structures as well as lattice mismatched structures which include at least the SiGe-on-insulator substrate material of the present invention. In the case of superlattice structures, such structures would include at least the substantially relaxed SiGe-on-insulator substrate material of the present invention, and alternating layers of Si and SiGe formed atop the substantially relaxed SiGe layer of the substrate material.

In the case of lattice mismatched structures, GaAs, GaP or other like III/V compound semiconductors would be formed atop the substantially relaxed SiGe layer of the inventive SiGe-on-insulator substrate material.

The following example illustrates the processing steps of the present invention which are used in forming a high quality SGOI substrate material.

EXAMPLE

Figure 9:
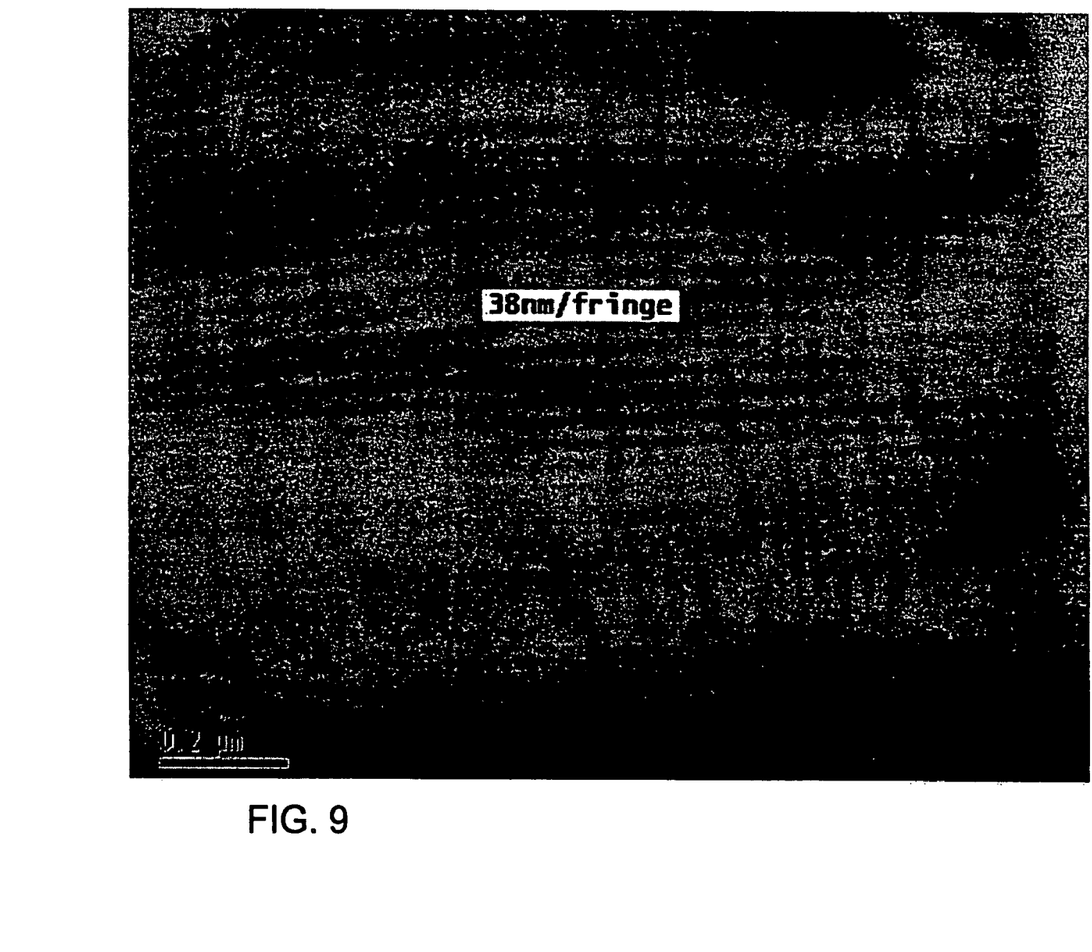
FIG. 9 is a plan-view transmission electron micrograph of a 1×1 μm SiGe island relaxed according to the present invention.

A 300 Å, 20% SGOI layer was formed and the unpatterned SiGe relaxation value was measured to be 0%, in other words, the layer was stable against defect production and therefore remained fully strained even though it was formed at 1200° C. The substrate was then processes in a manner typical of modern CMOS integrated circuit (IC) processing, whereby a shallow trench isolation procedure was performed. This process resulted in a thin (80 Å) oxide layer over the SiGe, followed by 550 Å silicon nitride deposition. The SiN/SiO$_2$/SGOI film stack was then patterned into islands by conventional lithographic techniques and etching the exposed regions down to the buried oxide layer. The exposed sidewalls in the etch trench were protected by a thin thermal oxynitride layer and the regions between the islands were filled with deposited oxide. After subjecting this structure to a thermal step of 1200° C. for 3 hours in dilute O$_2$-Ar (0.1% O$_2$) the relaxation of the patterned structure was studied using Moiré analysis in plan-view transmission electron microscopy (shown in FIG. 9). 1×1 μm islands were measured to have an in-plane lattice parameter of about 0.5% larger than Si. This corresponds to about 70% relaxation, with no defects observed in the transmission electron microscopy image (FIG. 9). In this example, island sizes greater than 5×5 μm did not relax. If larger islands required relaxation then thicker SiGe layers or thinner SiN layers would be used to promote lateral expansion of the SiGe layer.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

We claim:

1. A method of fabricating a silicon germanium-on-insulator substrate material comprising:
   forming an oxidation mask on exposed horizontal and sidewall surfaces of a SiGe-containing island structure, said SiGe-containing island structure is located on a barrier layer that is resistant to Ge diffusion; and
   heating to cause at least relaxation within said SiGe-containing island structure whereby said oxidation mask substantially prevents consumption of said SiGe-containing island structure during said heating step, wherein said heating is performed in an oxidizing ambient that includes at least one oxygen-containing gas.

2. The method of claim 1 wherein said SiGe-containing island structure comprises a strained or partially relaxed SiGe layer.

3. The method of claim 1 wherein said SiGe-containing island structure comprises a bilayer including a single crystal Si layer and an overlaying SiGe layer that is strained or partially relaxed.

4. The method of claim 1 wherein said barrier layer is a component of a silicon-on-insulator substrate or a silicon germanium-on-insulator substrate.

5. The method of claim 1 wherein said SiGe-containing island structure is formed by lithography and etching.

6. The method of claim 1 wherein said barrier layer is patterned.

7. The method of claim 1 wherein said barrier layer is a continuous layer.

8. The method of claim 1 wherein said SiGe-containing island structure comprises at least a Si$_x$Ge$_{1-x}$ alloy wherein x is 0 or a number less than 1 that is formed by an epitaxial growth process selected from the group consisting of low-pressure chemical vapor deposition, atmospheric pressure chemical vapor deposition, ultra-high vacuum chemical vapor deposition, molecular beam epitaxy, plasma-enhanced chemical vapor deposition, and ion-assisted deposition.

9. The method of claim 1 wherein said SiGe-containing island structure comprises at least a Si$_x$Ge$_{1-x}$ alloy wherein x is 0 or a number less than 1 that is formed utilizing isotopically enriched Si and Ge gas sources.

10. The method of claim 1 wherein said oxidation mask is formed by deposition and optional etching.

11. The method of claim 1 wherein said oxidation mask comprises an insulating oxide, nitride or combination thereof.

12. The method of claim 11 wherein said insulating material comprises $SiO_2$, SiN or a combination thereof.

13. The method of claim 1 wherein said forming said oxidation mask is a step of a trench isolation formation process.

14. The method of claim 1 wherein said oxidation mask is a nitride layer that has a positive or negative stress.

15. The method of claim 1 wherein a surface oxide layer forms during said heating step.

16. The method of claim 15 further comprising removing said surface oxide layer utilizing a wet chemical etch process or dry etching.

17. The method of claim 1 wherein said at least one oxygen-containing gas comprises $O_2$, NO, $N_2O$, steam, ozone, air or mixtures thereof.

18. The method of claim 1 further comprising an inert gas, said inert gas being employed to dilute said at least one oxygen-containing gas.

19. The method of claim 1 wherein said heating is performed at a temperature from about 900° to about 1350° C.

20. The method of claim 1 further comprising removing said oxidation mask after said heating.

21. The method of claim 20 further comprising forming a strained Si layer surrounding said SiGe-containing island that has been at least relaxed by said heating step.

22. The method of claim 21 wherein said strained Si layer is formed from an isotopically enriched Si gas source.

23. A method of fabricating a semiconductor structure comprising:
forming an oxidation mask on at least sidewalls of a SiGe-containing island structure, said SiGe-containing island structure is located on a barrier layer that is resistant to Ge diffusion;
heating to cause at least relaxation within said SiGe-containing island structure whereby said oxidation mask substantially prevents consumption of at least the sidewalls of said SiGe-containing island structure during said heating step;
removing said oxidation mask; and
forming a strained Si layer surrounding said SiGe-containing island structure that has been at least relaxed.

24. A method of fabricating a semiconductor structure comprising:
forming an oxidation mask comprising a nitride layer that has a positive or negative stress on exposed horizontal and sidewall surfaces of a SiGe-containing island structure, said SiGe-containing island structure is located on a barrier layer that is resistant to Ge diffusion; and
heating to cause at least relaxation within said SiGe-containing island structure whereby said oxidation mask substantially prevents consumption of said SiGe-containing island structure during said heating step.

* * * * *